United States Patent [19]
Metz

[11] Patent Number: 5,640,127
[45] Date of Patent: Jun. 17, 1997

[54] INPUT PROTECTION FOR HIGH BANDWIDTH AMPLIFIER

[75] Inventor: Arthur J. Metz, Gervais, Oreg.

[73] Assignee: Tektronix, Inc., Wilsonville, Oreg.

[21] Appl. No.: 554,692

[22] Filed: Nov. 7, 1995

[51] Int. Cl.$^6$ .................................................. H03F 3/04
[52] U.S. Cl. ........................ 330/298; 327/309; 327/320
[58] Field of Search .............................. 330/110, 201 P, 330/298; 327/309, 320, 325

[56] References Cited

U.S. PATENT DOCUMENTS

| | | | |
|---|---|---|---|
| 4,495,643 | 1/1985 | Orban | 327/309 X |
| 5,241,282 | 8/1993 | Poole | 327/320 X |

*Primary Examiner*—Steven J. Mottola
*Attorney, Agent, or Firm*—Boulden G. Griffith

[57] ABSTRACT

A high bandwidth amplifier circuit with input protection is achieved by providing a signal limiting diode circuit in the path to the positive input of the amplifier and a cross-over signal feed path for coupling a portion of the input signal from the input signal source side of the signal limiting diode circuit to the negative input of the amplifier. To maximize the overall circuit bandwidth and minimize VSWR and noise, the cross-over signal feed path is designed to couple over to the negative input of the amplifier a signal that has at a higher-end of the bandwidth range an increasing amplitude and increasingly leading phase relationship relative to the amplitude limited version of the input signal being coupled to the positive input of the amplifier. In a desirable embodiment, most of the circuitry is contained on an integrated circuit and bond wires needed for coupling serve as inductors and tune the circuitry.

8 Claims, 6 Drawing Sheets 5,640,127

INPUT PROTECTION FOR HIGH BANDWIDTH AMPLIFIER

FIELD OF THE INVENTION

This invention relates to high bandwidth amplifiers, and more particularly to circuitry for providing electrostatic discharge protection and overvoltage protection for such amplifiers.

BACKGROUND OF THE INVENTION

Various methods have been used in the past to attempt to provide electrostatic discharge and overvoltage protection for high bandwidth amplifiers. One of these methods has been to use a diode bridge as a signal limiter in the main signal path, as shown in FIGS. 1 and 2.

FIG. 1 shows one prior art input protection circuit utilizing a full diode bridge as the signal limiter. In this circuit the signal limiter is positioned after the input termination resistor and external to the integrated circuit containing the amplifier to be protected. FIG. 2 shows another prior art input protection circuit utilizing a full diode bridge as the signal input limiter. However, in this circuit the limiter is placed between the input transmission line and the input termination resistor, and both the limiter and the termination resistor are external to the integrated circuit containing the amplifier to be protected.

Putting the termination resistor in front of the signal limiting diode bridge, as shown in FIG. 1, has produces at least four advantages: 1) the input impedance remains nearly the same when an overload signal causes the diode bridge to disconnect the input signal from the positive input terminal of the amplifier, 2) the standing current in the diodes can be relatively low because the amplifier's input impedance is high, 3) the attenuation caused be the bridge is low (again because the amplifier's input impedance is high), and 4) the offset voltage applied to the amplifier's negative input has little effect on the linearity of the signal input limiting diode bridge. This arrangement also produces two disadvantages: A) some of the bandwidth is lost because of the series resistance of the diodes and because of the capacitances associated with the diode bridge and its biasing components, and B) noise is increased because of the increase in resistance in series with the amplifier's positive input.

Putting the termination resistor after the signal limiting diode bridge, as shown in FIG. 2, improves the attainable bandwidth, at least if the resulting combined impedances can successfully be kept close to the characteristic impedance of the input transmission line. Keeping the combined impedances matched with the characteristic impedance of the transmission line bandwidths above 1 GHz typically requires implementing the diode bridge in hybrid circuitry, and doing so increases the costs involved. Moreover, this approach has several other drawbacks: 1) the signal attenuation is increased because the resistance of the diode bridge in series with the termination resistor forms a voltage divider that reduces the voltage across the termination resistor alone, 2) larger bias currents are required to minimize the voltage attenuation and non-linearity caused by the impedance of the diode bridge, and these larger bias currents increase power consumption and cause related problems, 3) overvoltages that cause the signal limiting diode bridge to disconnect the signal path also produce relatively large reflections because the termination resistor is also disconnected along with the amplifier, and 4) there is a reduced range of offset voltages that can be effectively applied to the negative input of the amplifier without causing non-linearity in the effects caused by the diode bridge.

What is desired is a way to protect high bandwidth amplifiers from electrostatic discharge and overvoltage without significant degradation of bandwidth, and without an increase in noise or the voltage standing wave ratio (VSWR), and without adversely affecting the power consumption of the overall circuit.

SUMMARY OF THE INVENTION

In accordance with the invention, a high bandwidth amplifier circuit with input protection is achieved by providing a signal limiting diode circuit in the path to a positive input of the amplifier and a cross-over signal feed path for coupling a portion of the input signal from the input signal source side of the signal limiting diode circuit to a negative input of the amplifier. To maximize the overall circuit bandwidth and minimize the VSWR and noise, the cross-over signal feed path is designed to couple over to the negative input of the amplifier a signal that has at a higher-end of the bandwidth range an increasing amplitude and increasingly leading phase relationship relative to the amplitude limited version of the input signal being coupled to the positive input of the amplifier. In a desirable embodiment, most of the circuitry is contained on an integrated circuit and bond wires needed for coupling serve as inductors and tune the circuitry.

DETAILED DESCRIPTION OF THE INVENTION

Figure 3:
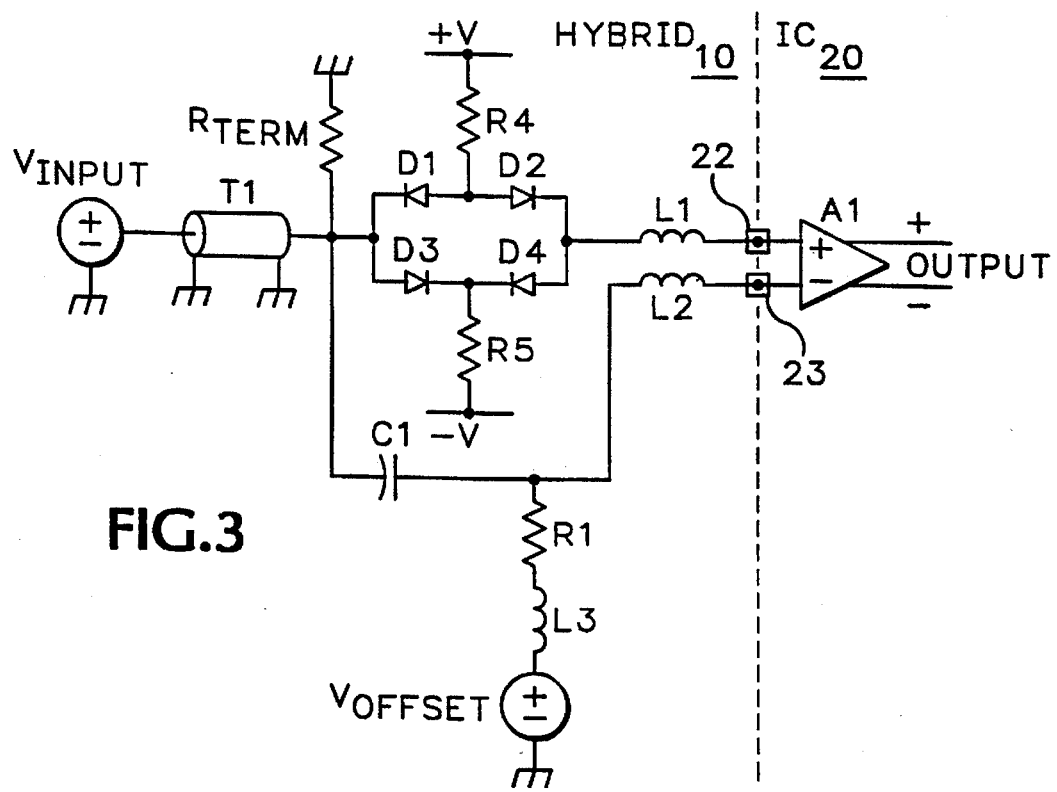
FIG. 3 is a schematic diagram of an input protection circuit similar to the prior art circuit shown in FIG. 1, but modified according to the present invention with cross-over signal feed circuitry.

Referring first to FIG. 3, a differential high bandwidth amplifier A1 has positive and negative inputs and outputs and is a fabricated on an integrated circuit (IC) 20. The input signal to be amplified, $V_{INPUT}$ is delivered to a hybrid circuit 10 via transmission line T1. A termination resistor $R_{TERM}$ is connected between the transmission line T1 and ground, and is selected to match, in conjunction with the signal limiting circuitry that follows it, the characteristic impedance $Z_O$ of the transmission line T1.

A diode bridge consisting of diodes D1, D2, D3, and D4 is disposed in the main signal path within the hybrid 10 and is connected to the positive voltage supply +V by resistor R4 and to the negative voltage supply −V by resistor R5. The output of the diode bridge (the cathode of D2 and anode of D4) is coupled to pad 22 and the positive input of the amplifier A1 through an inductor L1. Inductor L1 may be as simple as a bond wire with some inductance, although the inductance can be made larger and any desired value for tuning by the use of a wire spiral or other inductive component, as can any of the inductive elements described below.

Figure 1:
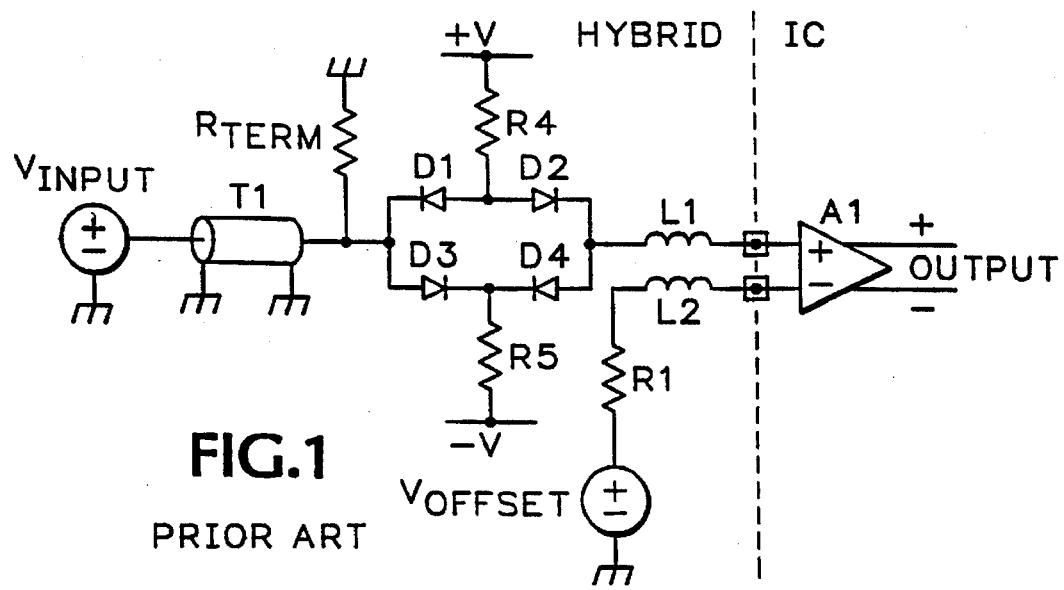
FIG. 1 is a schematic diagram of a prior art input protection circuit utilizing a full diode bridge as a signal input limiter, with the limiter positioned after the input termination resistor and external to the integrated circuit containing the amplifier to be protected.
Figure 2:
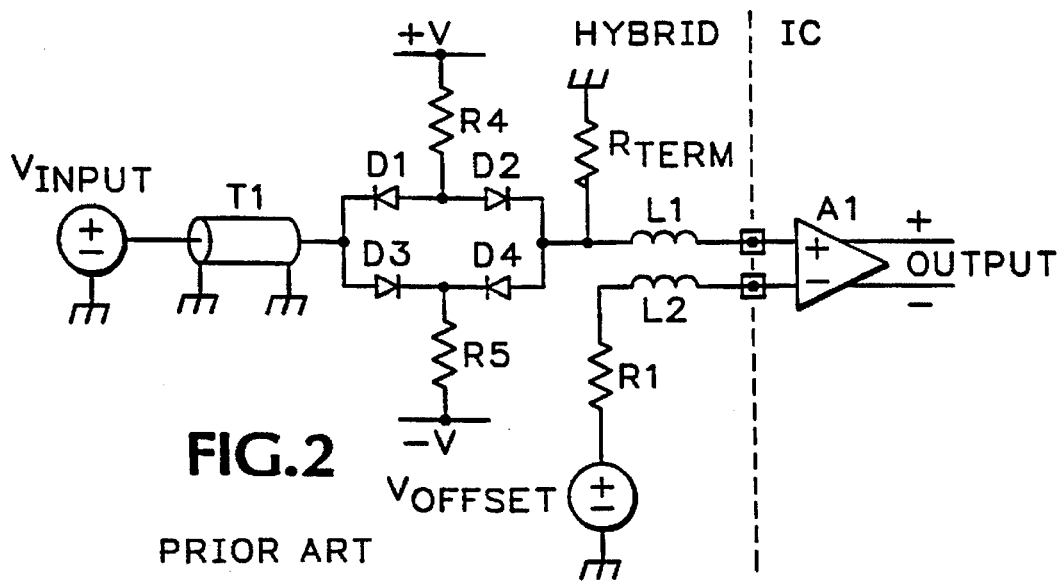
FIG. 2 is a schematic diagram of a prior art input protection circuit utilizing a full diode bridge as the signal input limiter, however in this circuit the limiter is between the input transmission line and the input termination resistor and both are external to the integrated circuit containing the amplifier to be protected.

The circuit shown in FIG. 3 differs from the prior art circuit shown in FIG. 1 in having cross-over signal feed circuitry C1, R1, and L3. While there was an R1 in FIG. 1, it was not part of a cross-over signal feed circuit. C1, R1, and L3 in this circuit are chosen carefully so that the differential voltage across the positive and negative inputs of the amplifier A1 remains nearly constant over the whole bandwidth of the amplifier. And, even though the total differential voltage applied to the amplifier A1 remains approximately constant, the component of signal input reaching the negative input of the amplifier increases while the component reaching the positive input of the amplifier decreases as the frequency of the input signal approaches the high end of the bandwidth of the circuitry at the positive input of the amplifier. Moreover, as the frequency increases the signal component passing through this cross-over signal feed circuitry increasingly leads in phase, as well as increasing in amplitude. At the same time, the signal component going through the signal limiting diode bridge to the positive input of the amplifier diminishes in amplitude and lags in phase due to the series resistance of the diode bridge and the capacitance contributions from stray capacitance and the input capacitance of the amplifier.

The overall effect of this cross-over signal feed is to extend the available bandwidth and improve the signal to noise ratio. The signal to noise ratio is improved at the higher frequencies because more overall differential signal reaches the inputs of the amplifier without the introduction of additional noise sources. The bandwidth of a good, low noise, high frequency amplifier is determined by its input capacitance and the driving impedance. Any added capacitance will tend to reduce the bandwidth, while any increase in series resistance will increase noise and reduce the bandwidth. Thus, it has generally been recognized in the prior art that there is not any practical way to provide signal limiting without increasing the input capacitance and/or the series impedance of the amplifier's positive input path. The present invention effectively circumvents this problem by providing the cross-over signal feed. Then, even though the positive input rolls off more at higher frequencies in response to the presence of the diode limiter, the cross-over signal feed circuitry effectively compensates for this by supplying extra drive to the negative input at those frequencies.

Figure 4:
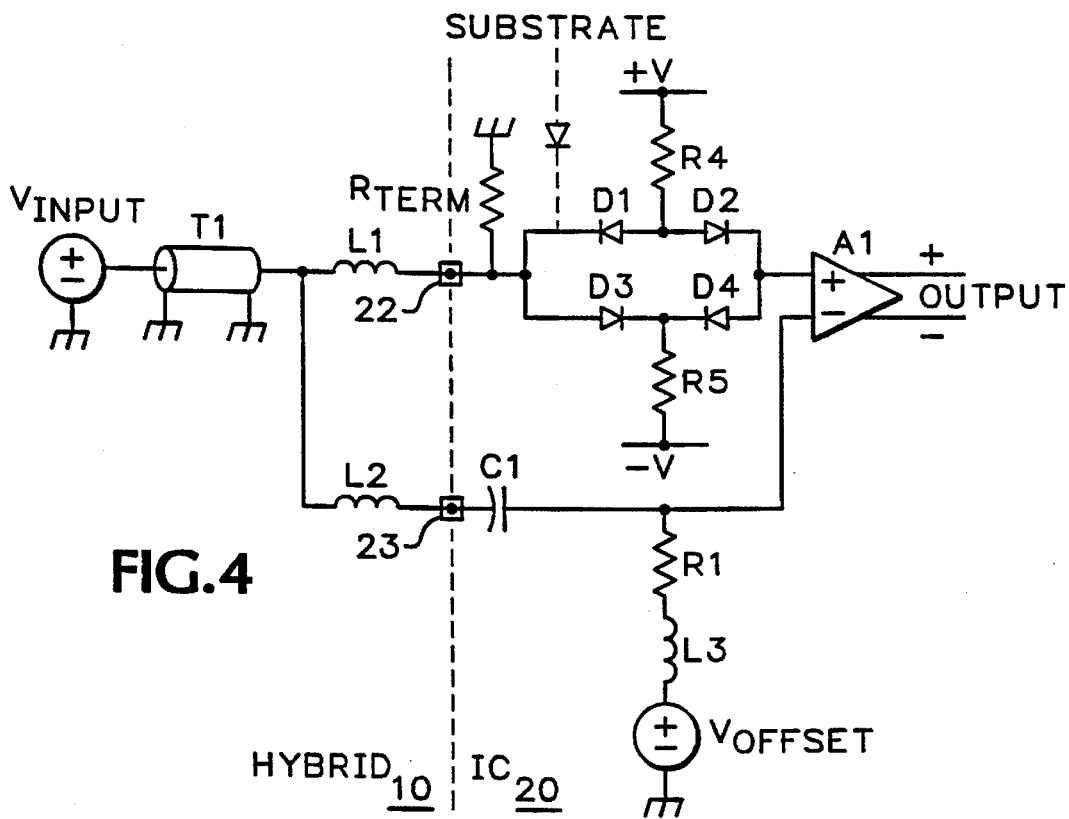
FIG. 4 is a schematic diagram of another input protection circuit according to the present invention, but with the signal limiter and cross-over signal feed circuitry implemented within the integrated circuit.

Referring now to FIG. 4, the circuit shown in FIG. 3 can be improved, at least in some senses, by moving the signal limiting diode bridge components D1, D2, D3, D4, R4 and R5 into the integrated circuit 20. When this is done, the bond wire inductance L1 can be used to tune the response rather than serving to limit the frequency response. Inductance L2 is made as small as possible. This implementation is more compact and has a lower cost relative to the more hybrid-based design shown in FIG. 3, but it does not provide the same degree of robust input protection because the on-chip diodes have a breakdown voltage that is smaller than that for discrete diodes. Moreover, the value of the full bridge configuration is limited in monolithic designs because existing silicon processes only provide diodes that have a parasitic diode from every diode cathode to the IC substrate, and this limits the input voltage that can be tolerated to one diode voltage below the substrate potential.

Figure 5:
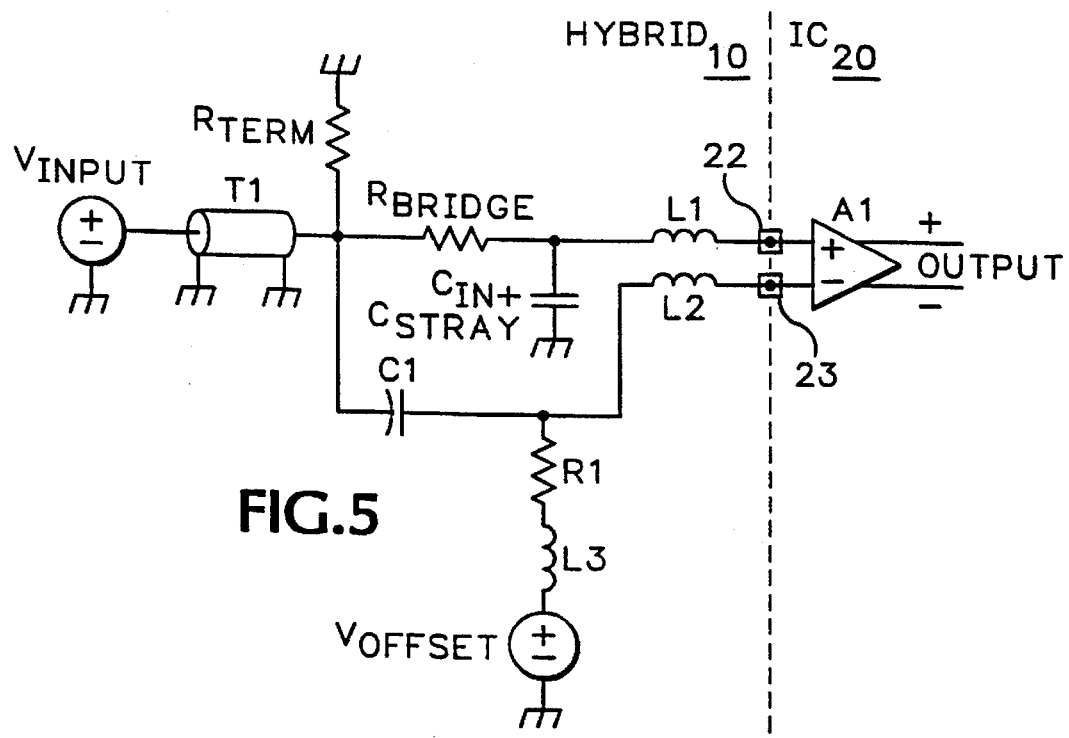
FIG. 5 is an equivalent circuit illustration of the circuit shown in FIG. 3, wherein the diode bridge is shown as a resistor and its capacitance and that of the amplifier input is shown explicitly.
Figure 6:
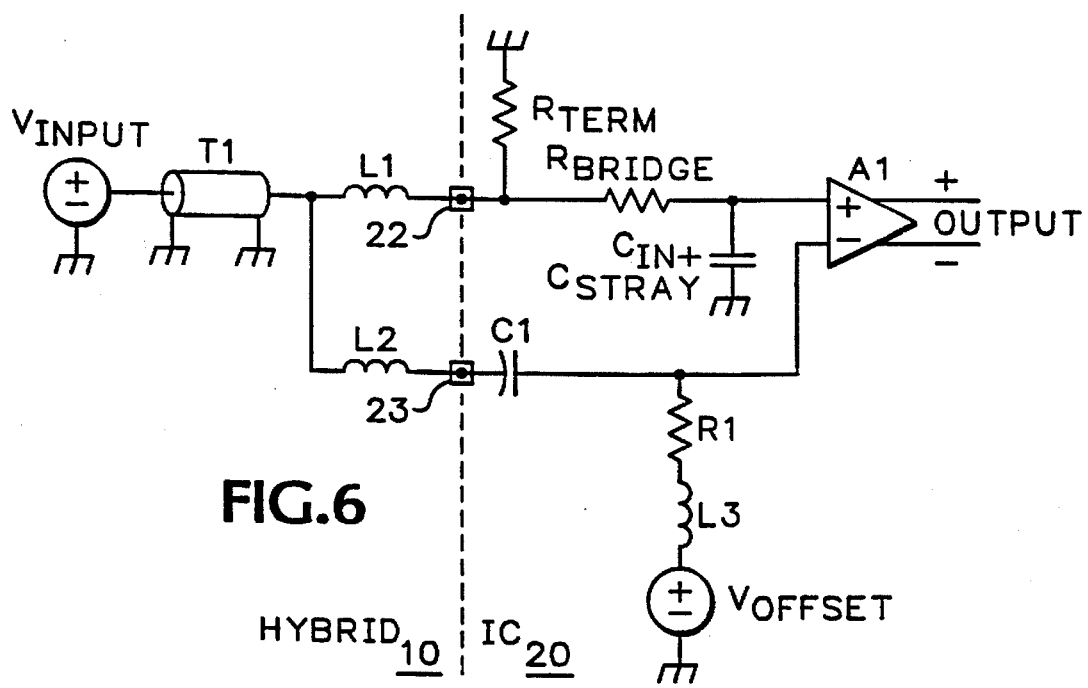
FIG. 6 is an equivalent circuit illustration of the circuit shown in FIG. 4, wherein the diode bridge is shown as a resistor and its capacitance and that of the amplifier input is shown explicitly.

Referring next to FIG. 5, this figure shows the circuitry of FIG. 3 in equivalent circuit form. In this form the diode bridge appears as a resistor $R_{bridge}$ and its capacitance and that from the amplifier input in shown as a single capacitor $C_{IN}+C_{STRAY}$. The cross-over signal feed circuitry has not changed from the form in which it was shown in FIG. 3, and it can be seen that it will produce a phase lead at high frequencies, because at those frequencies capacitor C1 looks increasingly like a direct conductor for the currents involved. And, at those same higher frequencies, the capacitance $C_{IN}+C_{STRAY}$ to ground (which is now shown explicitly) produces a phase lag in the main signal path. Thus, the equivalent circuits analysis is consistent with the behavior described above, and can be equivalent circuit form, with the diode bridge shown as a resistor and its capacitance and explained most simply in terms of current leading through a capacitor and voltage lagging across a capacitor. Referring next to FIG. 6, this figure shows the circuitry of FIG. 4 in equivalent circuit form, with the diode bridge shown as a resistor and its capacitance and that of the amplifier input shown explicitly as $C_{IN}+C_{STRAY}$. The same basic analysis that applied to FIGS. 3 and 5 also applies here, except that now $R_{TERM}$, $R_{BRIDGE}$, and $C_{IN}+C_{STRAY}$ are all inside the IC 20.

Figure 7:
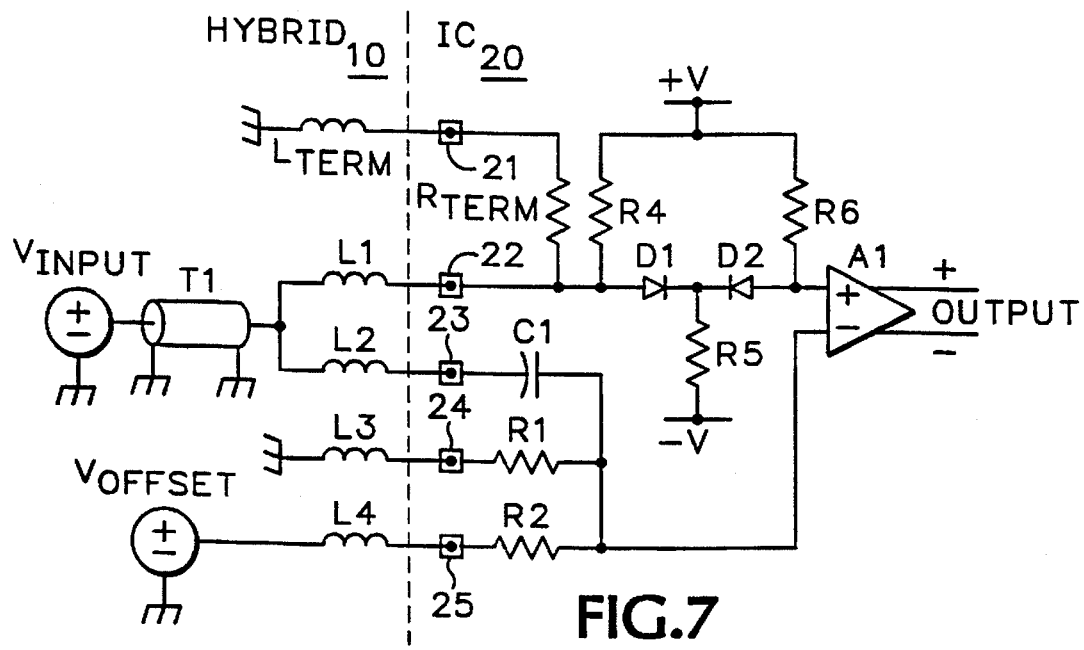
FIG. 7 is a schematic diagram of another input protection circuit according to the present invention, this one having a preferred version of the signal limiting circuitry and other improvements.

Referring next to FIG. 7, the input voltage range that can be tolerated can be increased by only using half of the diode bridge, i.e., D1 and D2 arranged as shown in FIG. 5. This increases the input voltage that can be tolerated by the breakdown voltage of D1, and increases the available bandwidth by eliminating the parasitic capacitances associated with the missing diodes.

In this configuration, the input signal is applied to two inductors L1 and L2. The inductors L1 and L2 can again be a simple bond wire or, in the case of L1, some other inductive element capable of producing a larger and more certain inductance, depending on what is required to match the characteristic impedance $Z_O$ of the transmission line T1. L2 should generally have a smaller inductance than L1, and preferably as close to zero as possible. L2 has been implemented successfully as a very short bond wire coupled to somewhat larger bond wire used to implement L1. L1 couples the input signal to pad 22 of the integrated circuit 20, which in turn connects to termination resistor $R_{TERM}$, another resistor R4, and the anode of Schottky diode D1. $R_{TERM}$ connects back through pad 21 to a termination shunt-peaking inductor $L_{TERM}$ on the hybrid circuit 10 and through it to the hybrid circuit's ground. The other side of R4 is connected to the positive voltage supply +V of the integrated circuit 20. The cathode of D1 is connected to the cathode of another Schottky diode D2 and to resistor R5. The other end of resistor R5 is connected to the negative voltage supply −V of the integrated circuit 20. The anode of D2 is connected to the positive input of the amplifier A1 and to resistor R6, the other end of which is also connected to the positive voltage supply +V of the integrated circuit 20.

An adjustable offset voltage is applied to the negative input of A1 through an inductive element L4, an input pad 25 of the IC 20, and a resistor R2. The inductive element L4 is external to the integrated circuit 20 and is typically created by a bond wire of the hybrid circuit 10. The negative input of A1 is also connected to a ground on the hybrid circuit 10 through resistor R1, pad 24, and another inductive element L3. The negative input of A1 is also coupled back to the input signal path through (small) capacitor C1, pad 23, and inductor L2.

Resistors R1 and R2 provide a ground return for the negative input to the amplifier A1 and a means of introducing the offset voltage to A1 so that the input signal may be centered with respect to the amplifier's dynamic range. The parallel combination of R1 and R2 should typically be an approximate match to the impedance at the positive input of the amplifier A1, or $Z_o/2+R_{BRIDGE}$. Schottky diodes D1 and D2 act to disconnect the amplifier A1 from excessively large input signals from any source. In addition to providing a return path to ground for the amplifier A1, inductor L3 also serves to optimize the amplifier's bandpass flatness at the high end and is selected accordingly. Inductor $L_{TERM}$ is selected to optimize the VSWR of the overall circuitry, and may be a wire or other source of inductance with its value chosen accordingly.

The termination resistor $R_{TERM}$ is selected so that the parallel impedance of it and the impedance looking into the limiting network of D1, D2, R4, R5, and R6 matches the characteristic impedance $Z_O$ of the transmission line T1. Because integrated circuit implementations of the high bandwidth amplifier A1 have a relatively low input capacitance, only small biasing currents, typically 2–4 mA, are required for the limiter. Therefore, resistors R4, R5, and R6 can be chosen to be quite large relative to the termination resistor $R_{TERM}$, so that the impedance seen by the transmission line T1 does not change significantly when overvoltages occur, thus reducing an reflections generated in the presence of an overvoltage condition or transitions into and out of such an overvoltage condition.

For small signals the circuitry of the present invention operates in the following manner. At higher frequencies there is a bandwidth loss and a phase shift at the positive input of the amplifier A1. This occurs because at these frequencies the diodes appear to be resistors with some parasitic capacitance (as shown in FIGS. 5 and 6), and further capacitance is supplied by the shunt capacitance of the amplifier and parasitic capacitances of conductive runs. It the design is carefully optimized, the input signal that is presented through C1 to the negative input of the amplifier A1 increases in amplitude and increasingly leads in phase as the frequency of the signal gets higher. Thus, as the cutoff frequency of the amplifier A1 is approached, it is driven with an increasingly balanced and out-of-phase set of negative and positive inputs, resulting in increased bandwidth and in reduced second harmonic distortion.

In the presence of large positive input signals, diode D2 turns off and the input current available to the positive input of the amplifier A1 is only that available through resistor R6, and its value is selected to be such as to ensure that this current is too small to damage the amplifier. In the presence of large negative input signals, diode D1 turns off and the maximum voltage applied to the positive input of amplifier A1 is limited to that set by the network formed by R6, D2, and R5, and that is a value that will not produce currents sufficient to harm the amplifier either.

Figure 8:
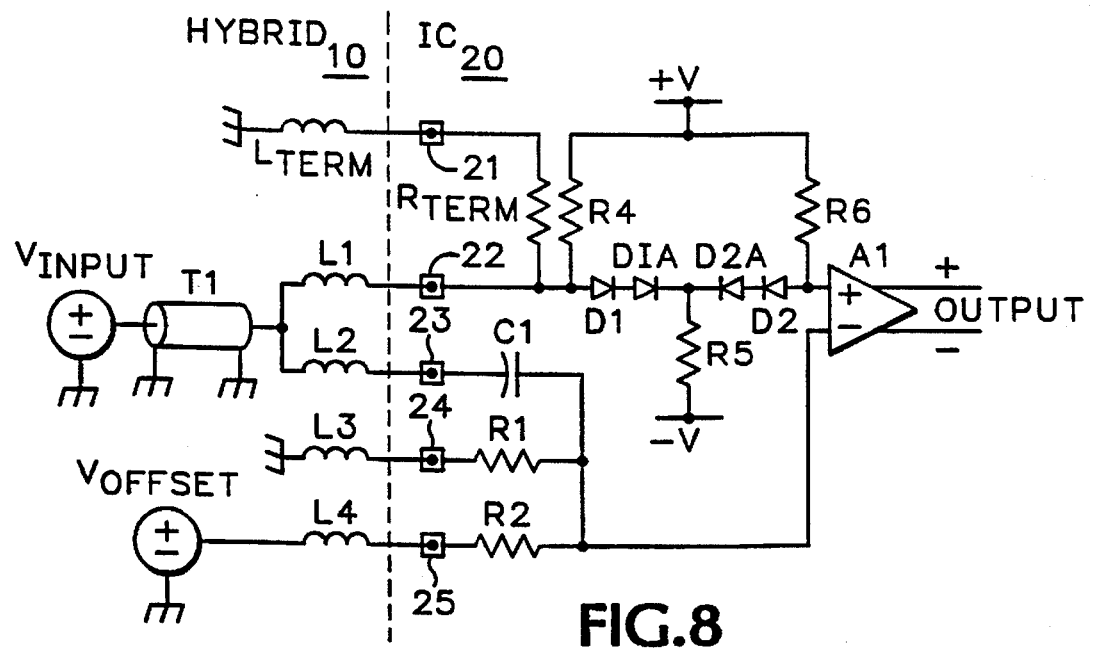
FIG. 8 is a schematic diagram of an alternative embodiment of the circuitry shown in FIG. 7 wherein the diodes of the signal limiting circuitry are each replaced with plural diodes.

Referring finally to FIG. 8, the maximum short-term voltage overload, positive or negative, that this protection circuit can accommodate without undergoing permanent damage is determined by the breakdown voltage of the diodes D1 and D2. This range can therefore be extended by replacing each individual diode with two or more diodes connected in series. Longer term overloads also pose a threat to the termination resistor $R_{TERM}$. The danger posed by these longer term overloads can avoided by augmenting the overload protection described above with an on-chip RMS detector to sense the input power and trip a relay in the input path to protect the this circuitry when enough power is present to cause damage.

For good high frequency linearity, the standing current in diodes D1 and D2 must be sufficient to charge the amplifier A1's input capacitance, but no larger. Larger bias currents result in higher power dissipation and lower values of R4, R5, and R6, and lower values of these resistors tend to shunt the termination resistor $R_{TERM}$. The termination resistor $R_{TERM}$ is chosen so that in conjunction with $R_{BRIDGE}$ the combined resistance matches the characteristic impedance of the input signal transmission line T1. C1, the capacitor in the cross-over signal feed circuit, is chosen to be quite small in order to limit the maximum energy that can be delivered to the amplifier A1 when the circuit input goes into an overvoltage condition. C1 is also chosen so as to make it possible to tune the values of C1, L1, and L4 to achieve a good input impedance match and thereby minimize the VSWR while maintaining the overall circuit bandwidth.

Figure 9:
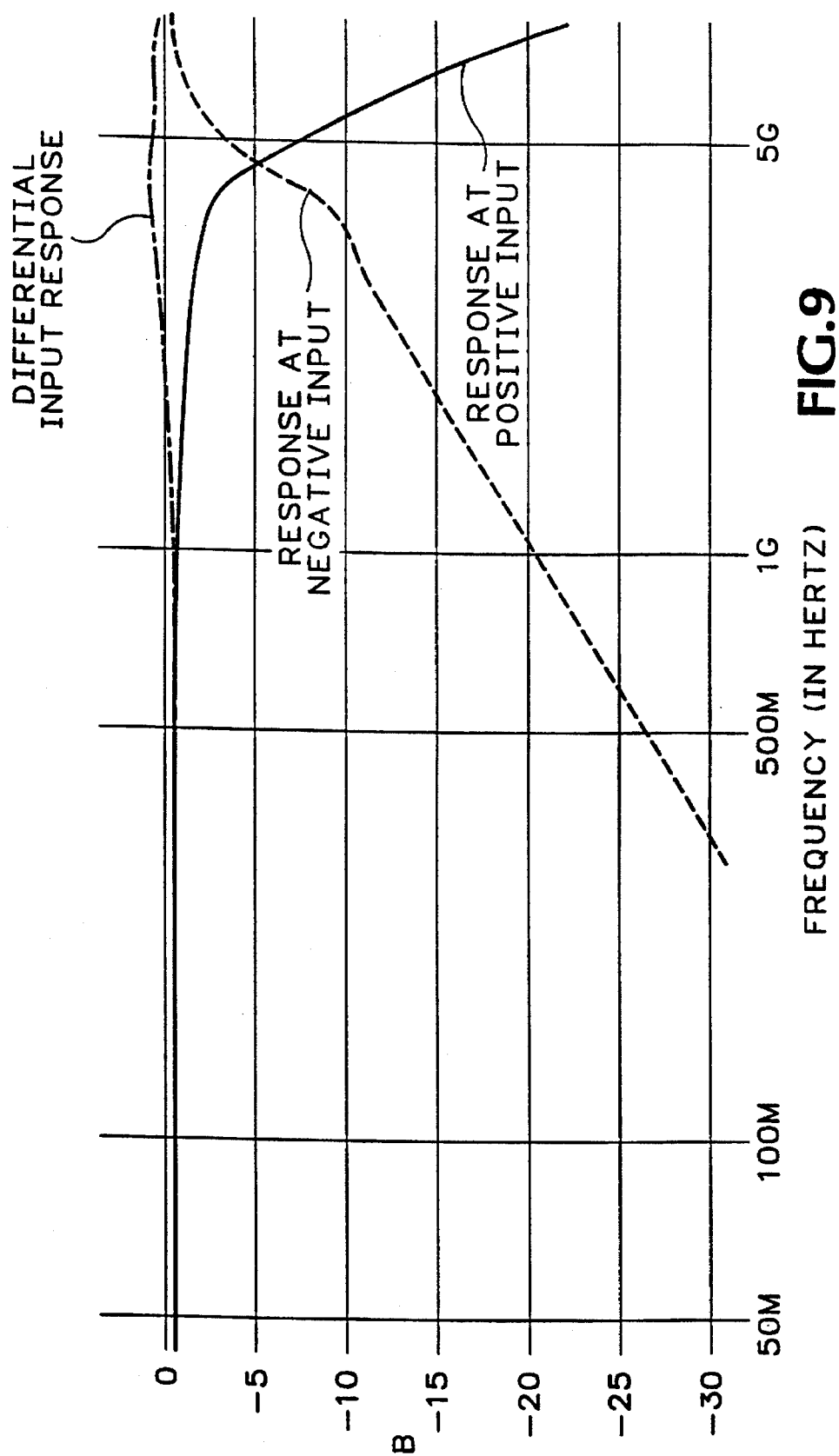
FIGS. 9 and 10 are graphs showing frequency response and transient response curves, respectively.
Figure 10:
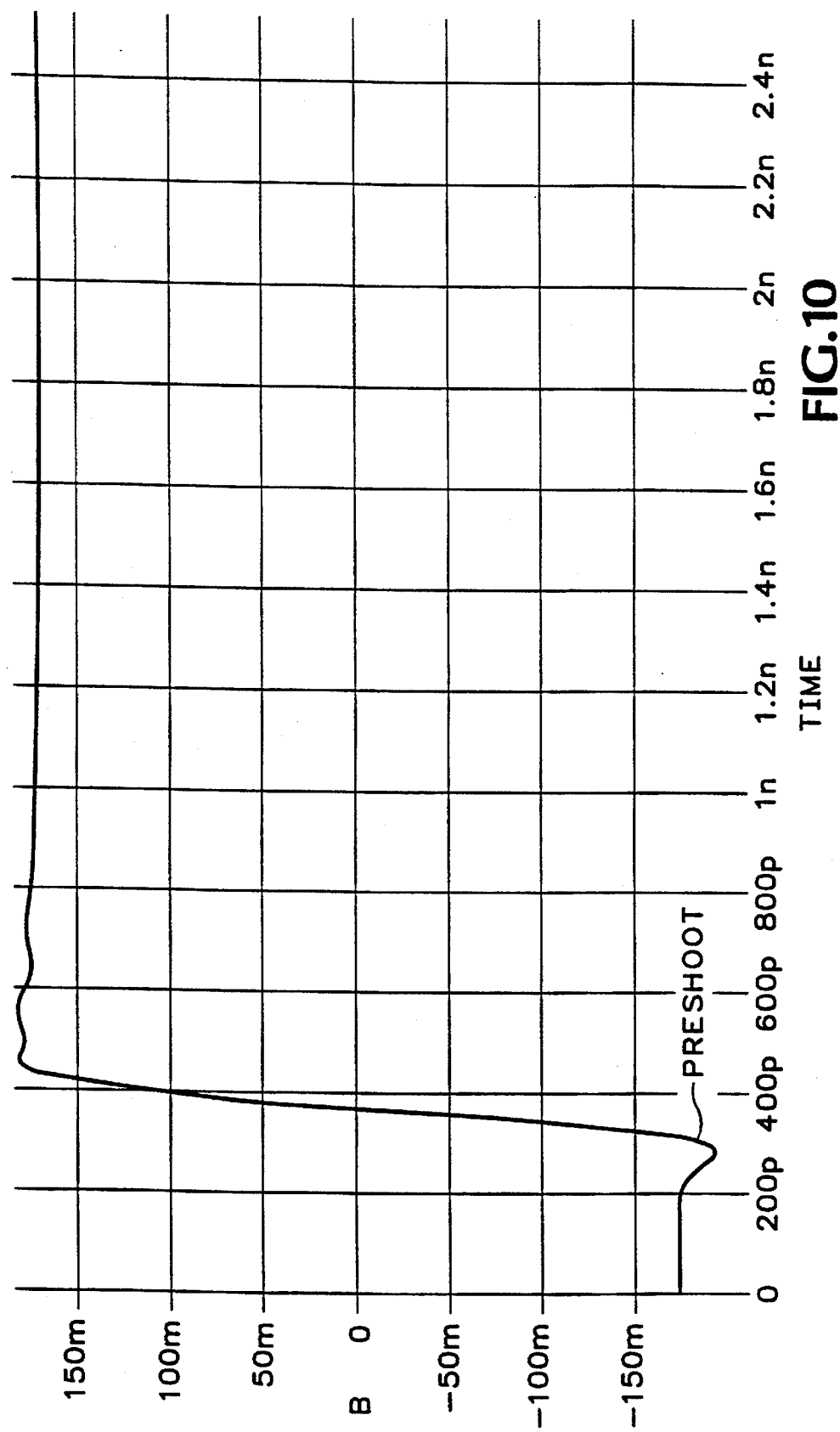

Referring next to FIG. 9, in a desirable embodiment the "differential input response" curve shown in the long-short dashed line at the top is achieved by the combination of inputs labeled "response at the negative input" (shown as a dashed line) and "response at the positive input" (shown as a solid line). The cross-over signal characteristic shown can produce a very high circuit bandpass, but the transient response will then exhibit preshoot, as shown in FIG. 10. Thus, the choice of C1 represents a compromise between bandwidth and transient response preshoot. In most systems where other amplifiers or track-and-hold circuits follow this circuit, some preshoot is desirable because it yields lower overall system rise time for a given bandwidth, and the preshoot will be filtered out by the downstream circuitry (not shown).

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

I claim:

1. A high bandwidth amplifier circuit with input protection comprising:
   an amplifier having a first input, a second input, and a bandwidth range;
   an input signal source having a characteristic impedance;
   signal limiting means disposed to receive the input signal from the input signal source and couple an amplitude limited version of the input signal to the first input of the amplifier; and
   cross-over signal feed means disposed to couple a portion of the input signal from the input signal source to the second input of the amplifier, said cross-over signal feed means including direct current blocking means.

2. A circuit according to claim 1 wherein the portion of the input signal being coupled by the cross-over signal feed means has at a higher-end of the bandwidth range an increasing amplitude and increasingly leading phase relationship relative to the amplitude limited version of the input signal being coupled to the first input of the amplifier.

3. A circuit according to claim 2 wherein the cross-over signal feed means comprises capacitive, resistive, and inductive circuit elements, with the capacitive circuit element disposed to block all direct current between the input signal source and the second input of the amplifier.

4. A circuit according to claim 1 wherein the signal limiting means comprises a diode bridge.

5. A circuit according to claim 1 wherein the signal limiting means comprises a first diode and second diode connected cathode-to-cathode in series between the input signal source and the first input of the amplifier.

6. A circuit according to claim 5 wherein the first and second diodes each comprise a plurality of diodes connected in series.

7. A circuit according to claim 1 wherein the amplifier and the signal limiting means are part of a single integrated circuit.

8. A circuit according to claim 3 wherein the circuit elements are chosen so as to cause the amplitude of the portion of the input signal being coupled to approximately equal the amplitude of the amplitude limited version of the input signal at a cutoff frequency of circuitry on a path to the first input of the amplifier.

* * * * *